US008832473B2

(12) United States Patent
Rumney

(10) Patent No.: US 8,832,473 B2
(45) Date of Patent: Sep. 9, 2014

(54) SYSTEM AND METHOD FOR ACTIVATING AT LEAST ONE OF A PLURALITY OF FANS WHEN CONNECTION OF A COMPUTER MODULE IS DETECTED

(75) Inventor: Gary Simon Rumney, Taoyuan County (TW)

(73) Assignee: Mitac International Corp., Kuei-Shan Hsiang, Tao-Yuan Hsien (TW)

( * ) Notice: Subject to any disclaimer, the term of this patent is extended or adjusted under 35 U.S.C. 154(b) by 253 days.

(21) Appl. No.: 13/480,457

(22) Filed: May 24, 2012

(65) Prior Publication Data
US 2013/0318365 A1 Nov. 28, 2013

(51) Int. Cl.
*G06F 1/00* (2006.01)

(52) U.S. Cl.
USPC ............................................. 713/300; 709/223

(58) Field of Classification Search
CPC ........... G06F 1/20; G06F 1/206; G06F 1/189; H05K 7/20
USPC ................................. 709/223, 226; 713/300
See application file for complete search history.

(56) References Cited

U.S. PATENT DOCUMENTS

| 7,992,011 | B2 * | 8/2011 | Yasuda et al. | 713/300 |
| 8,140,196 | B2 * | 3/2012 | Rozzi et al. | 700/300 |
| 2008/0052437 | A1 * | 2/2008 | Loffink et al. | 710/302 |
| 2008/0312888 | A1 * | 12/2008 | Vinson et al. | 703/2 |
| 2009/0106568 | A1 * | 4/2009 | James | 713/300 |
| 2011/0031809 | A1 * | 2/2011 | Yoshida et al. | 307/42 |
| 2013/0050254 | A1 * | 2/2013 | Tran et al. | 345/629 |
| 2014/0070629 | A1 * | 3/2014 | Kondou et al. | 307/117 |

OTHER PUBLICATIONS

Blade Server, Feb. 20, 2011, https://web.archive.org/web/20110220220208/http://en.wikipedia.org/wiki/Blade_server#Cooling.*

* cited by examiner

*Primary Examiner* — Mark Connolly
(74) *Attorney, Agent, or Firm* — Winston Hsu; Scott Margo

(57) ABSTRACT

A cloud server system may include a power module, a plurality of first connectors, at least one computer module including a second connector detachably electrically plugged into one of the each first connectors for receiving operational power, and a detection circuit configured to detect whether the first connector is electrically plugged into the second connector or not electrically plugged into the second connector to obtain the connection status. The cloud server system may further include a control module configured to act as a docking station interfacing with the internet for the at least one computer module so that the at least one computer module is hot swappable, and a plurality of fans. The control module may be configured to activate/deactivate and/or alter rotational speed of at least one of the plurality of fans according to the connection status.

19 Claims, 4 Drawing Sheets

SYSTEM AND METHOD FOR ACTIVATING AT LEAST ONE OF A PLURALITY OF FANS WHEN CONNECTION OF A COMPUTER MODULE IS DETECTED

BACKGROUND OF THE INVENTION

1. Field of the Invention

The present invention relates to a cloud server system, and more particularly, to a cloud server system that reduces total cost of ownership by detecting where and how many computer modules are being used.

2. Description of the Prior Art

A server is computer hardware system that runs at least one service as a host for a client. Such a service typically may be, inter alia, running a database, file, web, mail, or print server for a client computer.

Fueled by increasing demand for cloud computing, the need for additional and more efficient servers is growing rapidly. Whether constructing a single server or a large server farm some of the features needing serious consideration include initial cost, speed, size/density, power consumption, thermal footprint, HVAC (heating, ventilation, and air conditioning), and maintenance.

While changing these and other variables often results in a trade-off, for example increased speed often results in an increased thermal footprint, when taken together as a group these variables have a large impact on the Total Cost of Ownership (TCO) of the server. Because most servers are operated for economic reasons, reducing the TCO is becoming an important benchmark used in decision making when replacing or expanding the number of servers on-line today.

SUMMARY OF THE INVENTION

A cloud server system having a reduced Total Cost of Ownership is disclosed.

A cloud server system may include a power module, a plurality of first connectors, at least one computer module including a second connector detachably electrically plugged into one of the first connectors for receiving operational power, and a detection circuit configured to detect whether the first connector is electrically plugged into the second connector or not electrically plugged into the second connector to obtain the connection status.

When the connection status indicates the first connector is electrically plugged into the second connector, the first connector receives operational power from the power module, and when the first connector is not electrically plugged into the second connector, the first connector does not receive operational power from the power module.

The cloud server system may further include a control module configured to act as a docking station interfacing with the internet for the at least one computer module so that the at least one computer module is hot swappable when at least two second connectors are plugged into the first connectors. The power module may comprise a plurality of fans. The control module is configured to activate/deactivate and/or alter rotational speed of at least one of the plurality of fans according to the connection status of the first and second connectors.

A method of operating the above described cloud server system is also disclosed. The method includes detecting whether a computer module is electrically plugged into a first connector to generate a connection status. A power module provides operational power to the first connector when the connection status indicates the first connector is electrically plugged into the second connector. The power module does not provide operational power to the first connector when the connection status indicates the first connector is not electrically plugged into the second connector.

The method of operating a cloud server system further may include the control module activating/deactivating and/or altering rotational speed of at least one of the plurality of fans according to the connection status.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
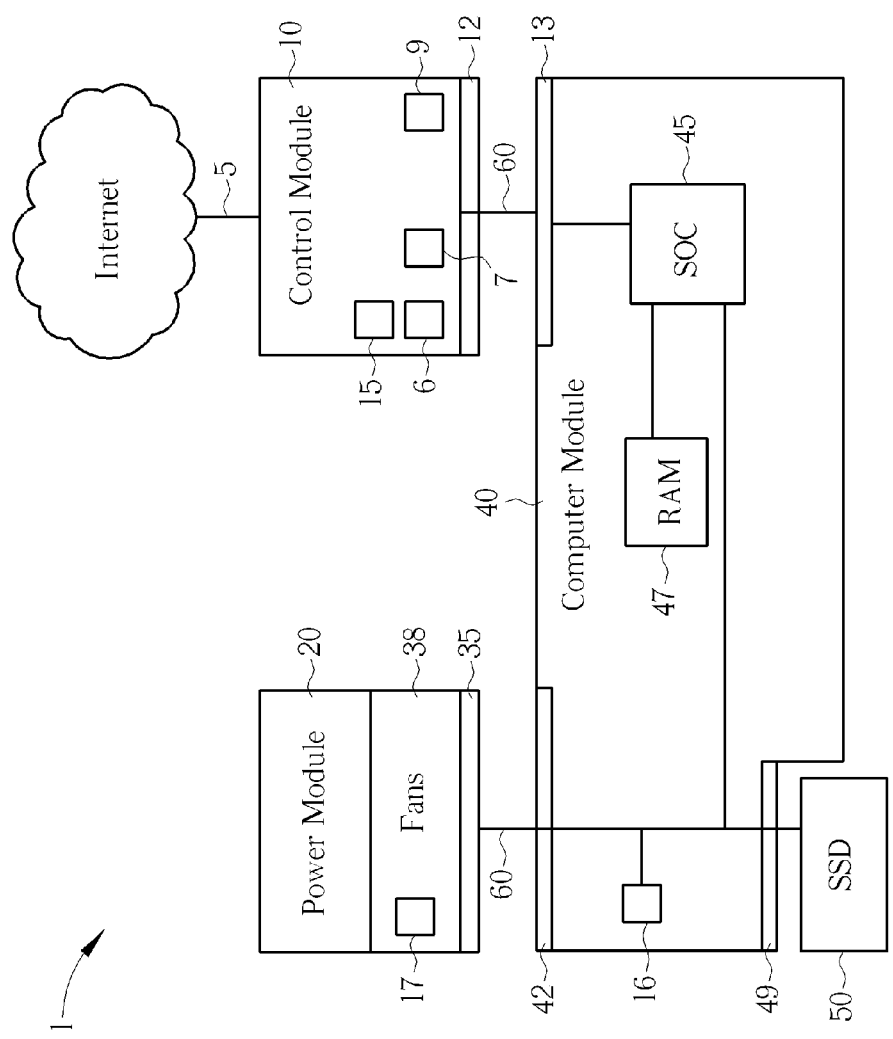
FIG. 1 is a block diagram of a possible cloud server system according to one embodiment of the present invention.

Please refer to FIG. 1 which is a block diagram of a possible cloud server system 1 with reduced Total Cost of Ownership (TCO). As FIG. 1 shows, a cloud server system 1 may include a control module 10 for controlling operations of the cloud server system 1, a power module 20 for providing operational power to the cloud server system 1, and at least one computer module 40 for running the host provided services.

The power module 20 may be physically a part of the control module 10 or maybe external to the control module 10. In either case both the control module 10 and power module 20 include all hardware necessary for making the appropriate electrical and data connections between them and the at least one computer module 40 and with each other as would be known to one skilled in the art. The power module 20 may further comprise a first connector 35 for electrically connecting the power module 20 to the cloud server system 1.

The control module 10 may comprise all components necessary for making connections with, using, and relaying data between the at least one computer module 40 and the internet through an external link 5, such as, inter alia, a processor 6, memory 7, and network controller and/or router 9. The control module 10 may function as a docking station for the at least one computer module 40. Because the control module 10 may act as the master controller of inputted and outputted data for the cloud server system 1 and may do all of the actual interfacing with the internet and simply relays received data to and from the at least one computer module 40, the presence or absence of any one of the at least one computer modules 40 has little more effect on the cloud system 1 than failure of a non-OS hard drive in a multi-drive system, making the at least one computer module 40 able to be hot swapped as long as there is always at least one computer module 40 remaining attached to the cloud server system 1 to maintain electrical connections between the control module 10, the at least one computer module 40, and the power module 20. The control module 10 may further comprise a third connector 12 for electrically connecting the control module 10 to the cloud server system 1.

The at least one computer module 40 may comprise a second connector 42 that is compatible with the first connector 35 comprised by the power module 20 allowing electricity be exchanged between the at least one computer module 40 and the power module 20. The at least one computer module 40 may further comprise a fourth connector 13 that is compatible with the third connectors 12 comprised by the control module 10, allowing electricity and data to be exchanged between the at least one computer module 40 and the control module 10.

The at least one computer module 40 may further comprise a System-on-a-Chip (SOC) 45, a volatile memory 47, and a connector 49 for interfacing with a non-volatile memory, preferably a solid state drive (SSD) 50 to increase density of the server due to reduced vibrations, but may be of another type such as a hard disk drive or a optical disc drive. Also preferably, the System-on-a-Chip 45 may comprise a plurality of processors of reduced instruction set computer (RISC) architecture, such as an ARM processor, but may be of another type such as an x86 processor if design considerations warrant it. A video processing chip is optional but is expensive and would also increase complexity while offering few if any benefits, so may not be present in some embodiments of the at least one computer module 40 to further reduce costs.

By locating the components for interfacing with the internet in the control module 10 and thus making the at least one computer module 40 hot swappable, maintenance cost can be reduced because a failed at least one computer module 40 can be easily removed and replaced. When only the computer module 40 fails and not the associated SSD 50, the associated SSD 50 can be connected to a spare computer module 40 and immediately placed back online. When only the SSD 50 fails and not the associated computer module 40, a new SSD 50 can be connected to an associated computer module 40 and immediately placed back online . When both the computer module 40 and the associated SSD 50 fail, both can be replaced and immediately be back online. All of these equipment swaps can be processed without having to shutdown and/or reboot the cloud server system 1, saving on downtime and maintenance costs.

The control module 10 may control operations of the cloud server system 1 via the use of one or more system controllers (preferably in the control module 10) electrically connected to the at least one computer module 40 via the connecting wires 60 which may be part of the first, second , third, and fourth connecters 35, 42, 12, 13. If a plurality of at least one computer modules 40 is simultaneously used, one or more of the at least one computer modules 40 may be independently and respectively controlled by the different system controllers to improve bandwidth, although communications between any two of the at least one computer modules 40 within the cloud server system 1 remains possible and fast due to sharing a common control module 10. Data and commands are preferably exchanged between the control module 10 and the at least one computer module 40 using differential pairs for efficiency, but other methods may be used according to design considerations. The connecting wires 60 shown in FIG. 1 represents such a differential pair along with appropriate first, second, third, and fourth connecters 35, 42, 12, 13.

The power module 20 provides the power through the first connectors 35 to the second connectors 42 of the at least one computer module 40 when the at least one computer module 40 is plugged into the first connector 35. The power through the first connector 35 would be disabled when the at least one computer module 40 is not plugged into the first connector 35.

Detection of whether the at least one computer module 40 is plugged into the first connector 35 can be done with a physical switch located on or near the first and second connectors 35, 42, (or third and fourth connectors 12, 13), or could be done electronically. In some embodiments, the power module 20 may require only a single electrical connection to an external source of power, but may transmit power from the power module 20 individually to each of the at least one computer modules 40 using different wires 60 in a one-to-many relationship. At least in this case of using different wires 60 to individually transmit power, electrical detection of a connected at least one computer modules 40 is preferred, perhaps by detecting whether the connecting wires 60 form a complete circuit. Components necessary to perform the detection could be located in the control module 10, power module 20, the connecting wires 60, or on the at least one computer module 40. As a result of the detection, a connection status is generated to indicate whether that particular first connector 35 is plugged into a second connector 42. The connection status may be of any form such as, inter alia, merely be a completed circuit, may be a binary signal, and/or may be a signal that includes to which first connector 35 the connection status belongs.

FIG. 1 shows some of the non-limiting possible locations as detection circuit 15 in the control module, detection circuit 17 in the power module 20, or detection circuit 16 on the at least one computer module 40. Normally, using either detection circuit 15 or detection circuit 17 is preferred as a single detection circuit could be fashioned, according to design considerations, to possibly monitor connection statuses of a plurality first connectors 35, while locating the detection circuit 16 on the at least one computer module 40 would demand individual detection circuits 16 on each of the at least one computer modules 40. As, in some embodiments, the hot swappable at least one computer module 40 is designed to be more or less disposable with failure, adding a detection circuit 16 may merely add to costs.

Figure 2:
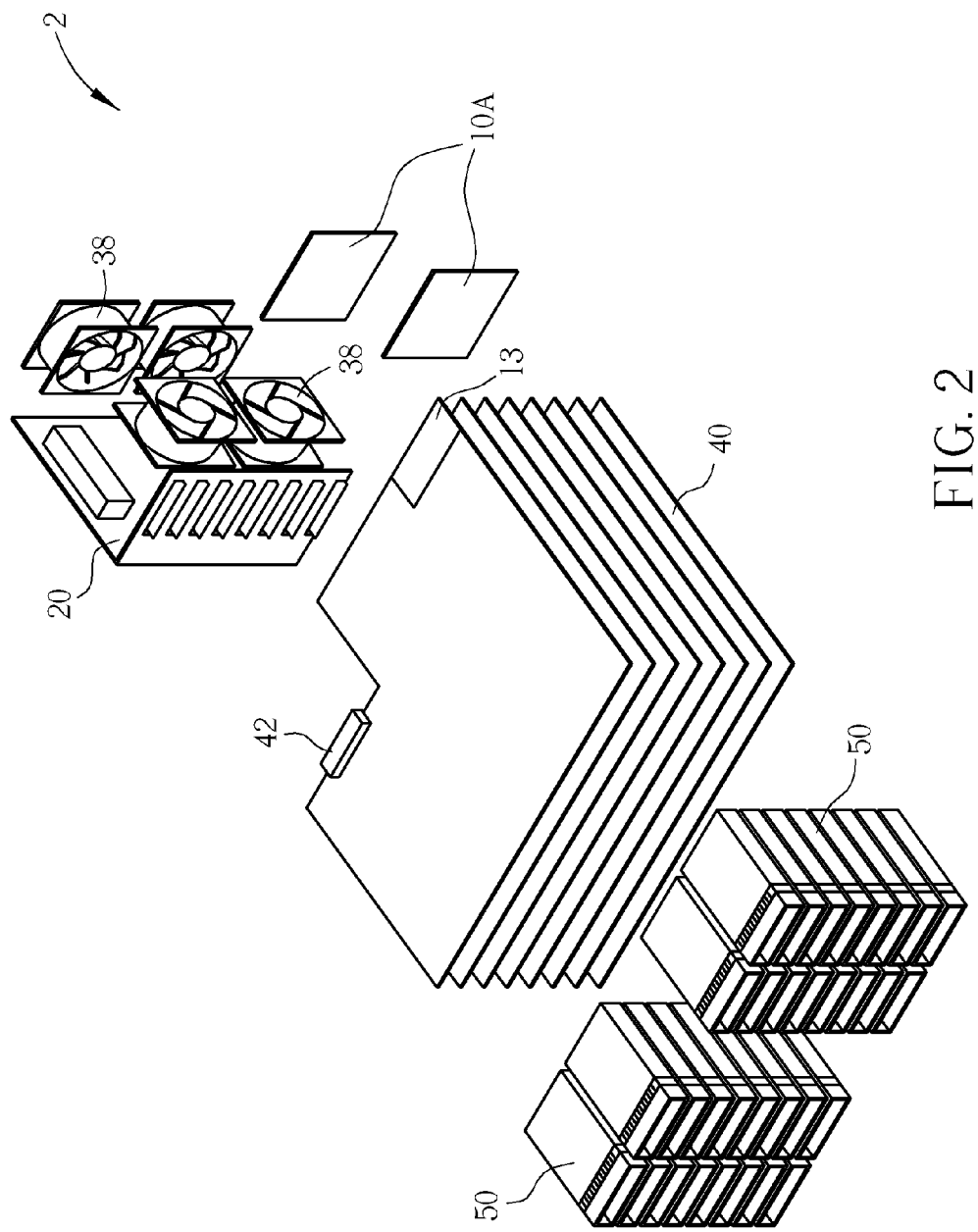
FIG. 2 shows an expanded view of an embodiment of a cloud server system similar to that shown in FIG. 1.

FIG. 2 shows an expanded view of an embodiment of a cloud server system 2. As shown in FIG. 2, the cloud server system 2 is similar to the cloud server system 1 and may use power module 20 with built in fans 38 positioned to cool the control module 10 and/or the at least one computer module 40, an SSD 50 corresponding to each of the at least one computer modules 40, and controller boards 10A that are part of the control module 10.

Figure 3:
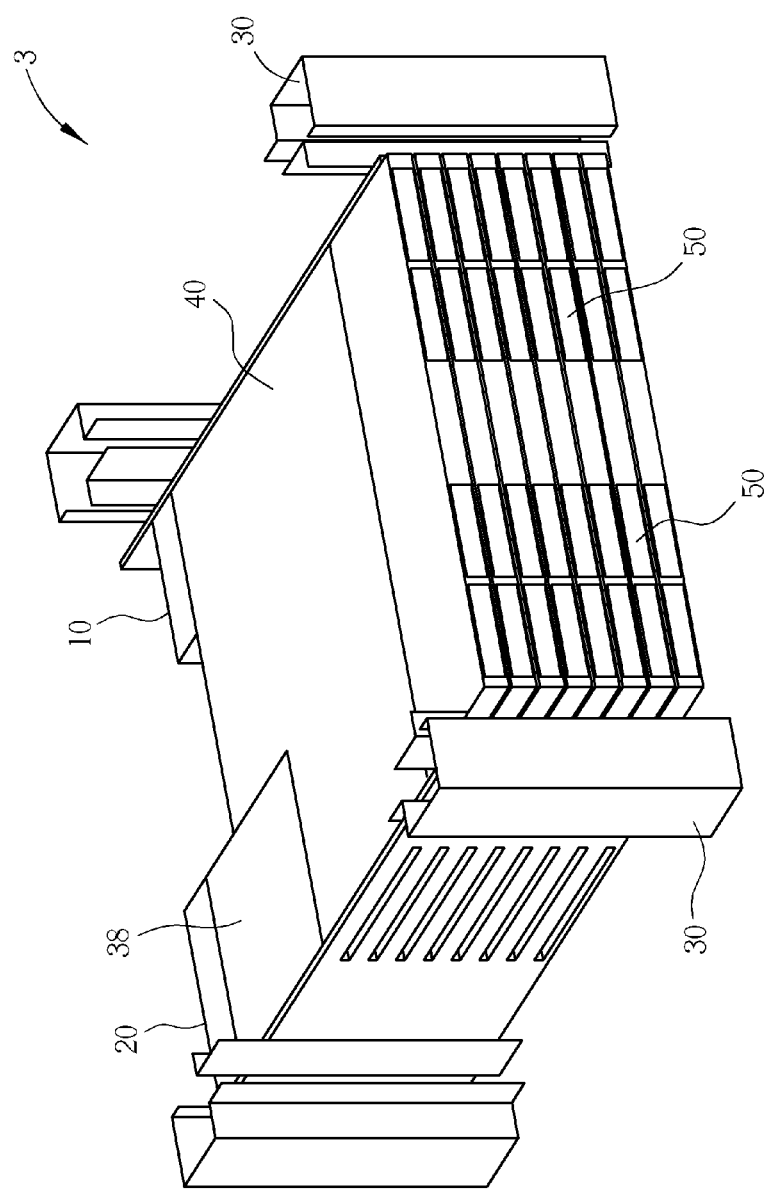
FIG. 3 shows an assembled view of embodiment of a cloud server system similar to that shown in FIG. 1.

FIG. 3 shows an assembled embodiment of a cloud server system 3 also similar to the cloud server system 1 and comprising the power module 20, the fans 38, the rack or housing 30, the at least one computer module 40, and the corresponding SSD 50.

As the power module 20 also provides power to the fans 38, heat and electrical costs of operating the cloud server systems 1, 2, 3 can be reduced by utilizing the generated connection statuses to determine which fans 38 and/or how many fans 38 are operating according to the number of, and/or location of, the at least one computer module 40 currently plugged into the first connectors 35.

For example, some embodiments activate fans 38 nearest the at least one computer module 40 while deactivating fans 38 further away from the at least one computer module 40 when they are not needed. Choice of which fans 38 to activate and which fans 38 to deactivate could be implemented using a switching system, perhaps using a look-up table, associating one or more first connectors 35 with one or more predetermined fans 38.

For example, an at least one computer module 40 plugged into a first connector 35 may activate a first fan 38 while unplugging the at least one computer module 40 from the first connector 35 may deactivate the first fan 38 if the first fan is no longer needed. Thus fan(s) 38 located near a plugged-in at least one computer module 40 may be activated, while fan(s)

38 located where no at least one computer module 40 are plugged-in may be deactivated. In normal practice, one fan 38 may be associated with a plurality of connectors 35, but this is not a limitation of the cloud server systems 1, 2, 3, nor is it necessary for the associated first connectors 35 to be adjacent.

Some embodiments activate some fans 38 and/or deactivate some fans 38 according to the number of the at least one computer modules 40 plugged into the cloud server systems 1, 2, 3. Choice of which fans 38 to activate and which fans 38 to deactivate could be implemented using a switching system, perhaps even a look-up table, associating one or more predetermined fans 38 with one or more threshold quantities of plugged in at least one computer modules 40. For a non-limiting example, when the number of at least one computer modules 40 plugged into first connectors 35 is less than a predetermined threshold, less than all of the fans 38 may activated. When the number of at least one computer modules 40 plugged into first connector 35 becomes greater than or equal to the predetermined threshold, additional fans 38 maybe activated. Some embodiments use more than a single threshold to increase/decrease the number of active fans 38.

Some embodiments may alter the rotational speed of at least one of the fans 38 in the cloud server systems 1, 2, 3 according to which first connecter 35 is plugged into one of the at least one computer module 40. Choice of which fans 38 to alter the rotational speed of could be implemented using a switching system, perhaps using a look-up table, associating one or more first connectors 35 with one or more predetermined fans 38.

For example, an at least one computer module 40 plugged into a first connector 35 may or may not cause the control module 10 to alter rotational speed of one or more fan(s) 38 while unplugging the at least one computer module 40 from the first connector 35 may cause the control module 10 to no longer actively alter the rotational speed of the one or more fan(s) 38. Thus fan(s) 38 located near a plugged-in at least one computer module 40 may be controlled to speed up and provide additional cooling, while fan(s) 38 located away from the plugged-in at least one computer module 40 may be slowed to provide a reduced amount of cooling. Again, in normal practice, one fan 38 may be associated with a plurality of first connectors 35, but this is not a limitation of the cloud server systems 1, 2, 3, nor is it necessary for the associated first connectors 35 to be adjacent.

Some embodiments may alter the rotational speed of at least one of the fans 38 in the cloud server systems 1, 2, 3 according to the quantity of the at least one computer modules 40 that are plugged into the cloud server systems 1, 2, 3. Rotational speed of the at least one of the fans 38 can be increased when additional cooling is necessary and can be decreased when a reduced level of cooling is acceptable, depending upon the number of plugged-in at least one computer modules 40.

Choice of whether to alter the rotational speed of the at least one fan 38 in the cloud server systems 1, 2, 3 could be implemented using a switching system, perhaps one or more thresholds or a look-up table, associating threshold numbers of plugged-in at least one computer modules 40 with rotational speed of the at least one fan 38. For a non-limiting example, when the number of at least one computer modules 40 plugged into the first connectors 35 is less than a predetermined threshold, the rotational speed of the at least one fan 38 maybe reduced. When the number of at least one computer modules 40 plugged into first connectors 35 is greater than or equal to the predetermined threshold, rotational speed of the at least one fan 38 maybe increased. Some embodiments use more than a single threshold to alter the rotational speed of the at least one fan 38.

Some embodiments may use combinations of the above described activating/deactivating and/or altering rotational speed of at least one of the fans 38 according to locations of and/or number of the at least one computer module 40 that is plugged into cloud server systems 1, 2, 3. For a non-limiting example, some embodiments may alter rotational speed of at least one fan 38 near a plugged in at least one computer module 40, while deactivating other fan(s) 38 not located near a plugged in at least one computer module 40.

Because fans 38 generate heat and noise while operating, shutting off unnecessary fans 38 and/or altering rotational speeds of fans 38 reduce the thermal and acoustic footprint of the cloud server systems 1, 2, 3, reducing TCO.

Figure 4:
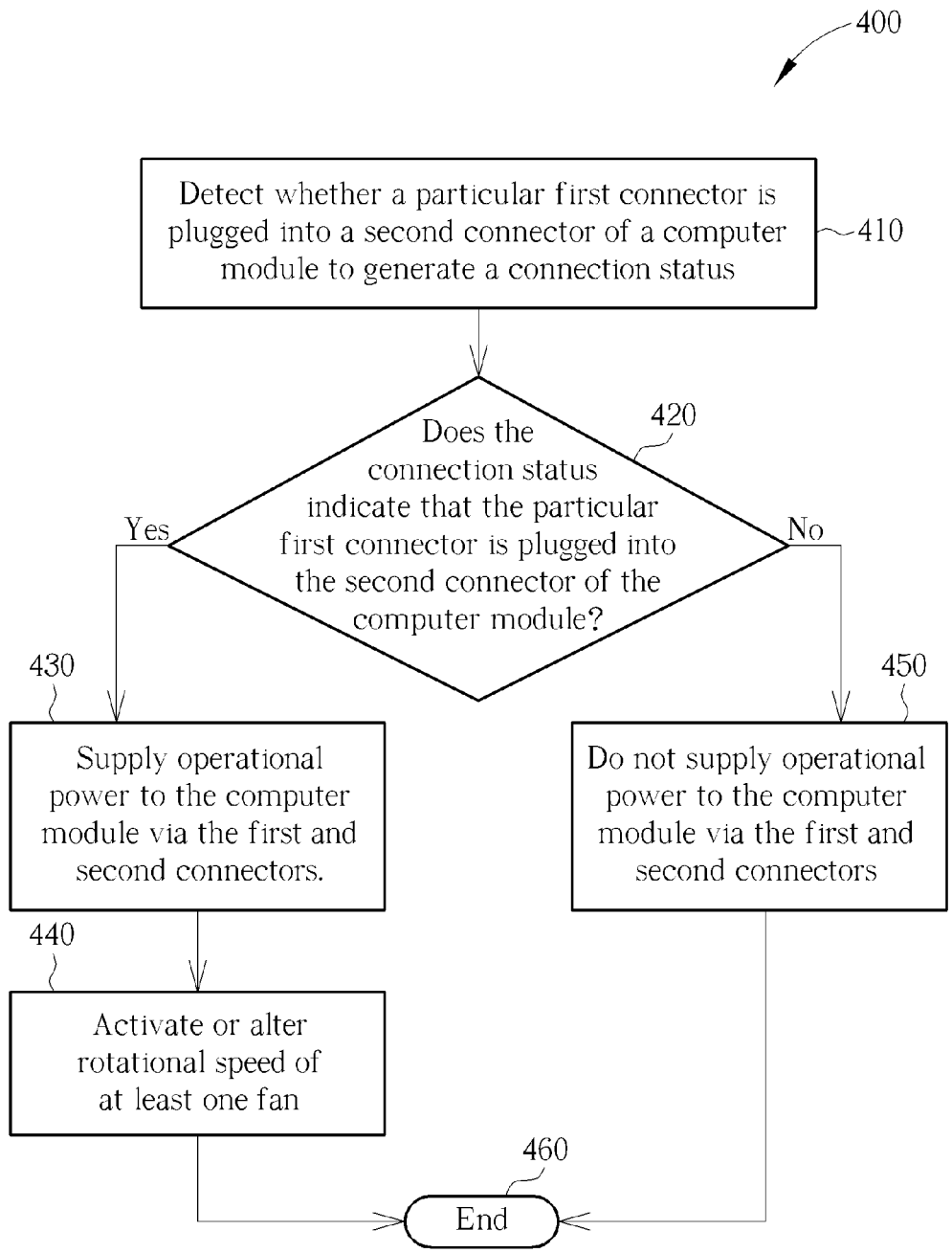
FIG. 4 is a flow chart of power and fan control for a cloud server system similar to that shown in FIG. 1.

FIG.4 is a flow chart 400 of power and fan control for a cloud server system similar to that shown in FIG.1. The flow chart 400 comprises the following steps, each of which is described in greater detail above.

Step 410: Detect whether a particular first connector is plugged into a second connector of a computer module to generate a connection status.

Step 420: Does the connection status indicate that the particular first connector is plugged into the second connector of the computer module? If NO, go to Step 450.

Step 430: Supply operational power to the computer module via the first and second connectors.

Step 440: Activate or alter rotational speed of at least one fan. Go to Step 460.

Step 450: Do not supply operational power to the computer module via the first and second connectors.

Step 460: End.

In summary, a cloud server system is presented having unique structures and usage enabling a reduced Total Cost of Ownership, by reducing size, initial investment, maintenance costs, electrical costs, and thermal and acoustic footprints.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A cloud server system comprising:
   a power module;
   a plurality of first connectors, each first connector of the plurality of first connectors configured to receive operational power from the power module via a different wire internal to the cloud server system, reception of the operational power at the each first connector selectable according to a connection status;
   at least one first computer module configured to run at least one service as a host for a client, the at least one computer module including a second connector detachably electrically plugged into one of the each first connectors for receiving the operational power;
   a detection circuit configured to detect whether the one of the each first connectors is electrically plugged into the second connector or not electrically plugged into the second connector to obtain the connection status; and
   a control module configured as an docking station interfacing with the internet for the at least one computer module so that the at least one computer module is hot swappable, the control module is further configured to activate at least one of a plurality of fans when the connection status indicates the one of the each first connectors is electrically plugged into the second connector;

wherein when the one of the each first connectors is electrically plugged into the second connector, the one of the each first connectors receives operational power from the power module, and when the one of the each first connectors is not electrically plugged into the second connector, the one of the each first connectors does not receive operational power from the power module.

2. The cloud server system of claim 1 wherein the control module is further configured to activate the at the least one of the plurality of fans closest to the one of the each first connectors having the connection status when the connection status indicates the one of the each first connectors is electrically plugged into the second connector.

3. The cloud server system of claim 1, wherein the control module is further configured to deactivate at least one of the plurality of fans when the connection status indicates the one of the each first connectors is not electrically plugged into the second connector.

4. The cloud server system of claim 1, wherein the control module is further configured to increase a number of activated fans of the plurality of fans when a number of the at least one computer module plugged into the first connectors is equal to or greater than a predetermined threshold.

5. The cloud server system of claim 1, wherein the control module is further configured to alter rotational speed of at least one of the plurality of fans closest to the one of the each first connectors having the connection status according to the connection status of the one of the each first connectors.

6. The cloud server system of claim 1, wherein the control module is further configured to alter rotational speed of an increased number of fans of the plurality of fans when a number of the at least one computer module plugged into the first connectors is equal to or greater than a predetermined threshold.

7. The cloud server of claim 1 wherein a first computer module of the at least one computer module is hot swappable when there is at least a second computer module of the at least one computer module remaining attached to the cloud server system to maintain electrical connections between the control module and the power module.

8. The cloud server of claim 1 wherein the control module comprises a processor, a memory, and a network controller, the control module further configured for making connections with, using, and relaying data between the at least one computer module and the internet through an external link.

9. The cloud server system of claim 1 wherein the at least one first computer module further comprises:
   a volatile memory;
   a third connector configured for electrically connecting to a non-volatile memory device; and
   a System-on-a-Chip including a plurality of processors of a reduced instruction set computer architecture coupled to the volatile memory and the third connector.

10. A cloud server system comprising:
   a power module having a single input cable and a plurality of output cables;
   a plurality of first connectors, each first connector of the plurality of first connectors configured to receive operational power from the power module via a different one of the plurality of output cables, reception of the operational power at the each first connector selectable according to a connection status;
   at least one computer module configured to run at least one service as a host for a client, the at least one computer module including a System-on-a-Chip having at least one processor of a reduced instruction set computer architecture and a second connector electrically plugged into one of the each first connectors for receiving the operational power;
   a detection circuit configured to detect whether the one of the each first connectors is electrically plugged into the second connector or not electrically plugged into the second connector to obtain the connection status; and
   a control module configured to act as a docking station interfacing with the internet for the at least one computer module so that the at least one computer module is hot swappable, the control module is further configured to activate at least one of a plurality of fans when the connection status indicates the one of the each first connectors is electrically plugged into the second connector;
   wherein when the one of the each first connectors is electrically plugged into the second connector, the one of the each first connectors receives operational power from the power module, and when the one of the each first connectors is not electrically plugged into the second connector, the one of the each first connectors does not receive operational power from the power module.

11. The cloud server system of claim 10, wherein the control module is further configured to activate at least one of the plurality of fans when a number of the at least one computer module plugged into the first connectors is equal to or greater than a predetermined threshold.

12. The cloud server system of claim 10, wherein the control module is further configured to alter rotational speed of at least one of the plurality of fans closest to the one of the each first connectors having the connection status according to whether the connection status indicates the one of the each first connectors is electrically plugged into the second connector.

13. The cloud server system of claim 10, wherein the control module is further configured to alter rotational speed of at least one of the plurality of fans when a number of the at least one computer module plugged into the plurality of first connectors is equal to or greater than a predetermined threshold.

14. A method of operating a cloud server system comprising a power module having a plurality of output cables, a plurality of first connectors, each of the first connectors configured to selectively receive operational power from the power module via a different one of the output cables, a control module configured as an docking station, at least one computer module configured to run at least one service as a host for a client and including a second connector detachably electrically plugged into one of the each first connectors;
   the method comprising:
   detecting whether the at least one computer module is electrically plugged into one of the each first connectors to generate a connection status;
   the control module interfacing with the internet for the at least one computer module so that the at least one computer module is hot swappable;
   the control module activating at least one of a plurality of fans when the connection status indicates the one of the each first connectors is electrically plugged into the second connector;
   the power module providing operational power to the one of the each first connectors when the connection status indicates the one of the each first connectors is electrically plugged into the second connector; and
   the power module not providing operational power to the one of the each first connectors when the connection status indicates the one of the each first connectors is not electrically plugged into the second connector.

15. The method of operating the cloud server system of claim 14, the method further comprising:
activating at least one of the plurality of fans closest to the one of the each first connectors having the connection status when the connection status indicates the one of the each first connectors is electrically plugged into the second connector.

16. The method of operating the cloud server system of claim 14, the method further comprising:
deactivating at least one of the plurality of fans when the connection status indicates the one of the each first connectors is not electrically plugged into the second connector.

17. The method of operating the cloud server system of claim 14, the method further comprising:
activating an increased number of the plurality of fans when a number of the at least one computer module plugged into the first connectors is equal to or greater than a predetermined threshold.

18. The method of operating the cloud server system of claim 14, the method further comprising:
altering rotational speed of at least one of the plurality of fans according to whether the connection status indicates the one of the each first connectors is electrically plugged into the second connector.

19. The method of operating the cloud server system of claim 14, the method further comprising:
altering rotational speed of at least one of the plurality of fans when a number of the at least one computer module plugged into the plurality of first connectors is equal to or greater than a predetermined threshold.

* * * * *